United States Patent
Anderson

(10) Patent No.: US 12,425,111 B2
(45) Date of Patent: Sep. 23, 2025

(54) METHOD AND SYSTEM FOR TESTING DEVICE UNDER TEST (DUT) OVER LONG DISTANCE

(71) Applicant: Keysight Technologies, Inc., Santa Rosa, CA (US)

(72) Inventor: Keith Frederick Anderson, Santa Rosa, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 334 days.

(21) Appl. No.: 18/101,997

(22) Filed: Jan. 26, 2023

(65) Prior Publication Data

US 2024/0259114 A1 Aug. 1, 2024

(51) Int. Cl.
*H04B 17/00* (2015.01)
*H03L 7/099* (2006.01)

(52) U.S. Cl.
CPC ......... *H04B 17/0085* (2013.01); *H03L 7/099* (2013.01)

(58) Field of Classification Search
CPC ............................ H04B 17/0085; H03L 7/099
See application file for complete search history.

(56) References Cited

U.S. PATENT DOCUMENTS

| | | | |
|---|---|---|---|
| 8,841,923 B1 | 9/2014 | Vanwiggeren | |
| 9,887,785 B1 * | 2/2018 | Anderson | H04B 1/16 |
| 9,967,085 B1 * | 5/2018 | Bradley | H04L 7/0075 |
| 10,386,444 B1 * | 8/2019 | Stickle | G01R 27/28 |
| 10,735,036 B1 | 8/2020 | Verspecht et al. | |
| 11,057,256 B1 | 7/2021 | Verspecht et al. | |
| 2010/0102829 A1 * | 4/2010 | Azarian | G01R 27/08 324/651 |
| 2015/0180416 A1 * | 6/2015 | Fernandez | G01R 31/3167 455/326 |

OTHER PUBLICATIONS

Stan Oda, "Improving Stability and Accuracy of High Frequency VNA Measurements Over Distance", Microwave Journal, Aug. 2020, pp. 1-4.

\* cited by examiner

*Primary Examiner* — Ping Y Hsieh

(57) ABSTRACT

A method and system synchronize first and second VNAs for testing a DUT over a long distance. The method includes receiving at the second VNA an RF signal from the first VNA; mixing the RF signal and an LO signal at the second VNA to output an IF signal to an ADC; determining a reference error ratio between a first reference clock in the first VNA and a second reference clock in the second VNA; adjusting an LO frequency to a corrected LO frequency by applying the reference error to a desired LO frequency; mixing the RF signal and the adjusted LO signal to output the IF signal; and resampling the IF signal at an adjusted sample rate to output a corrected IF signal corrected for the reference error, without adjustments being made to the first or second reference clock.

20 Claims, 6 Drawing Sheets

METHOD AND SYSTEM FOR TESTING DEVICE UNDER TEST (DUT) OVER LONG DISTANCE

BACKGROUND

A vector network analyzer (VNA) is typically used for performing measurements of a device under test (DUT) in setups where the test ports of the VNA are physically close together and synchronized. For example, the test ports share the same local oscillator (LO) and reference clock, and have a common trigger.

However, when using VNAs to perform measurements of a DUT over a long distance, such as antenna range measurements, for example, the test ports must be very far apart, e.g., at different geographical locations. Accordingly, measurements of the DUT over the long distance are best performed using two one-port VNAs working together as a distributed VNA. Typically, a distributed VNA requires sharing three signals between the two test ports: a local oscillator (LO) signal, a reference (clock) signal, and a trigger. However, due to the long distance between the test ports, these connections are difficult to establish, particularly with regard to synchronizing timing and operations of the two VNAs.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
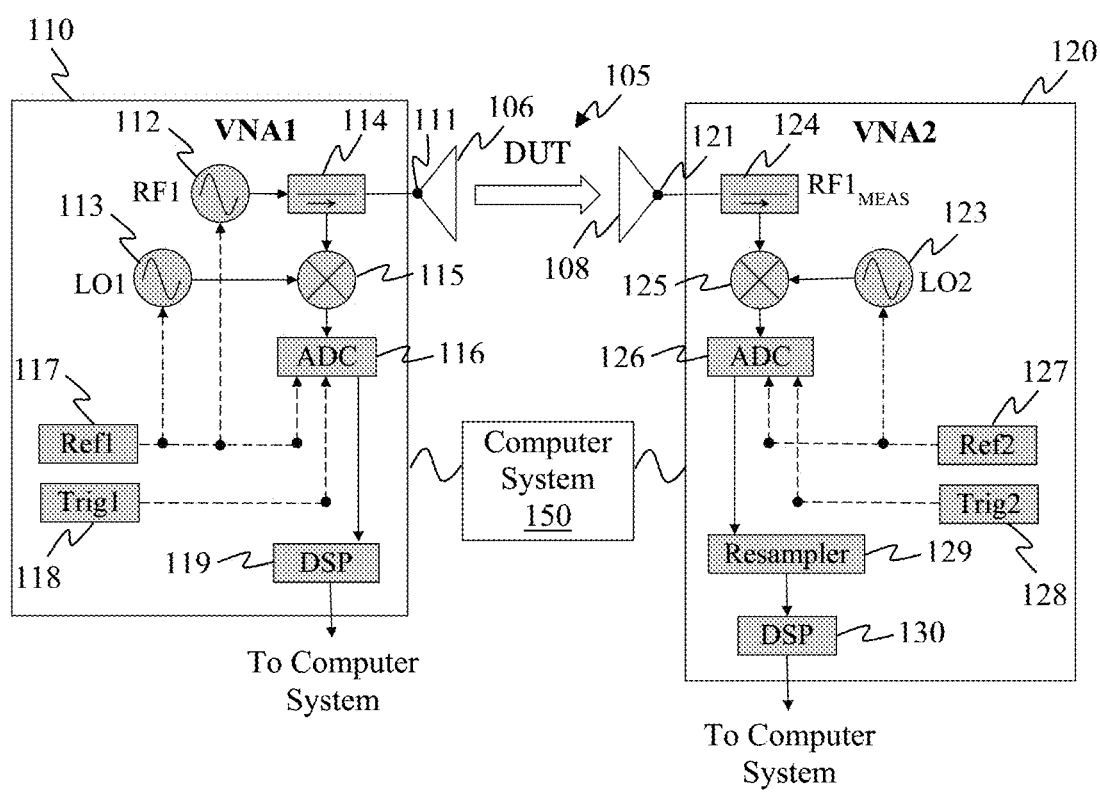
FIG. 1 is a simplified block diagram showing a system for testing a device under test (DUT) over a long distance using a first vector network analyzer (VNA) and a second VNA, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Various embodiments provide a distributed VNA for measuring a long DUT without having to share an LO signal, a reference signal, or a trigger between the two test ports, using digital signal processing to eliminate the need for these signals. This results in a simpler setup of the distributed VNA.

According to a representative embodiment, a system is provided for testing a DUT over a long distance. The system includes a VNA configured to transmit a radio frequency (RF) signal, where the first VNA includes a first reference clock configured to provide a first reference signal; a second VNA configured to receive and measure the RF signal transmitted over the long distance from the first VNA to provide a measured RF signal, where the second VNA includes a second reference clock configured to provide a second reference signal, where the second reference clock operates independently from the first reference clock; and a processing unit programmed to compensate for a reference error between the first reference clock and the second reference clock by adjusting a local oscillator (LO) frequency of an LO signal in the second VNA to determine a reference error ratio between the first reference clock and the second reference clock, correcting the LO frequency using the reference error ratio, mixing the LO signal at the corrected LO frequency and the measured RF signal to obtain an intermediate frequency (IF) signal, which is digitized, and controlling resampling of the digitized IF signal in the second VNA to output a corrected IF signal.

According to a representative embodiment, a system is provided for testing a DUT over a long distance. The system includes a first VNA, a second VNA and a processing unit. The first VNA includes a signal generator configured to generate an RF signal at an RF frequency, which may be a continuous wave (CW) signal; a first LO configured to generate a first LO signal having a first LO frequency; a first mixer configured to mix the RF signal and the first LO signal to output a first intermediate frequency (IF) signal, where the first IF signal has a first IF frequency; a first ADC configured to digitize the first IF signal; and a first reference clock configured to provide a first reference signal to the signal generator, the first LO, and the first ADC. The second VNA is configured to receive and measure the RF signal from the first VNA via the DUT, and includes a second LO configured to generate a second LO signal having a second LO frequency; a second mixer configured to mix the measured RF signal and the second LO signal to output a second IF signal; a second ADC configured to digitize the second IF signal; a resampler configured to resample the digitized second IF signal; and a second reference clock configured to provide a second reference signal to at least the second LO and the second ADC, where the second reference clock operates independently of the first reference clock. The processing unit is programmed to determine a reference error ratio between the first reference clock and the second reference clock; and adjust the second LO frequency at the second LO to a corrected second LO frequency by applying the reference error ratio to a desired second LO frequency. The second mixer is further configured to mix the measured RF signal and the second LO signal at the corrected second LO frequency to output the second IF signal, and the resampler is configured to resample the digitized second IF signal at an adjusted sample rate to output a corrected second IF signal corrected for the reference error ratio, such that the second VNA appears to use the second reference signal at a second reference frequency equal to a first reference frequency of the first reference signal without adjustments having been made to the first reference clock or the second reference clock.

According to another representative embodiment, a method is provided for synchronizing a first VNA and a second VNA for testing a DUT over a long distance, where the first VNA includes a first LO for generating a first LO signal having a first LO frequency and a first ADC, where the second VNA includes a second LO for generating a second LO signal having a second LO frequency and a second ADC, and where the first VNA and the second VNA do not share a reference clock or a trigger signal. The method includes receiving at the second VNA an RF signal from the first VNA, which may be a CW signal; mixing the measured RF signal and the second LO signal at the second VNA to output a second IF signal to the second ADC; determining a reference error ratio between a first reference clock and a second reference clock, where the first reference clock is configured to provide first reference signals to at least the first LO and the first ADC, and the second reference clock is configured to provide second reference signals to at least the second LO and the second ADC; adjusting the second LO frequency at the second LO to a corrected second LO frequency by applying the reference error ratio to a desired second LO frequency; mixing the measured RF signal and the second LO signal at the corrected second LO frequency to output the second IF signal; digitizing the second IF signal; and resampling the digitized second IF signal at an adjusted sample rate to output a corrected second IF signal corrected for the reference error ratio. The second VNA appears to be operating with the second reference signal at a second reference frequency equal to a first reference frequency of the first reference signal without adjustments having been made to the first reference clock or the second reference clock.

FIG. 1 is a simplified block diagram showing a system for testing a DUT over a long distance, according to a representative embodiment.

Referring to FIG. 1, system 100 provides a distributed VNA that includes a first VNA 110 and a second VNA 120 configured to measure RF signals through DUT 105 over a long distance. The DUT 105 may include one or both of a first antenna 106 connected to a first test port 111 of the first VNA 110 and a second antenna 108 connected to a second test port 121 of the second VNA 120 for communicating RF signals, where the system 100 may be measuring an antenna range, for example. "Long distance" refers to a distance between the first and second test ports 111 and 121 that is large enough to cause signal loss, which results in measurement noise and prevents the first and second VNAs 110 and 120 from accurately sharing LO, reference clock, and common trigger signals. For example, a distance between the first and second test ports 111 and 121 that exceeds about 10 meters may be considered a long distance. Although the first and second VNAs 110 and 120 are shown as one-port devices, it is understood that the first and second VNAs 110 and 120 may have two or more test ports, without departing from the scope of the present teachings. Likewise, the DUT 105, indicted as a two-port device, may be a multiport device (i.e., more than two ports), such as an antenna array, for example.

The system 100 further includes a computer system 150 generally configured to control the first and second VNAs 110 and 120, to combine respective measurements, and display the results. The computer system 150 may communicate with each of the first and second VNAs 110 and 120 via wired and/or wireless connections. Since the first and second VNAs 110 and 120 are unable to share the LO, reference clock, and trigger signals, they are synchronized by the computer system 150 using firmware and digital signal processing, as discussed below. Although FIG. 1 shows one computer system 150, it is understood that other configurations may be implemented without departing from the scope of the present teachings. For example, the system 100 may include two processing units, where a first processing unit is connected to the first VNA 110, a second processing unit is connected to the second VNA, and the first and second processing units are connected to each other via a wired or wireless local are network (LAN). The computer system 150 is described in more detail with reference to FIG. 3, below.

The first VNA 110 incudes a first RF signal generator 112 configured to generate an RF signal at an RF frequency, and a first LO 113 configured to generate a first LO signal at a first LO frequency. The first RF signal generator 112 may be an arbitrary waveform generator (AWG) or a direct digital synthesizer (DDS), for example. For purposes of calibration, the RF signal generated by the first RF signal generator 112 may be a continuous wave (CW) signal, referred to as a pilot tone.

The first VNA 110 further includes a forward directional coupler 114, a first mixer 115, a first analog to digital converter (ADC) 116, and a first digital signal processor (DSP) 119. The forward directional coupler 114 is configured to couple the RF signal generated by the first RF signal generator 112 to the first mixer 115, which mixes the RF signal with the LO signal from the first LO 113 to output a first intermediate frequency (IF) signal having a first IF frequency. The first ADC 116 digitizes the first IF signal output by the first mixer 115, and the first DSP 119 performs signal processing of the digitized first IF signal. The processed first IF signal may be output by the first DSP 119 to the computer system 150, for example.

The first VNA 110 also includes a first reference clock 117 configured to generate a first reference signal, and a first trigger source 118 configured to generate a first trigger signal. The first reference signal and the first trigger signal are provided to at least the first RF signal generator 112 and the first ADC 116. With regard to the first ADC 116, the first reference signal creates a first sample rate for sampling the first IF signal output by the first mixer 115.

The first VNA 110 may also include a reverse directional coupler configured to couple an RF signal received from the DUT 105 to another mixer, which mixes the received RF signal with the LO signal from the first LO 113 to output an IF signal corresponding to the received RF signal. The first VNA 110 may also include another ADC for digitizing the IF signal. However, the embodiments as described herein involve transmission of RF signals from the first VNA 110 to the second VNA 120, and therefore do not include use of the reverse directional coupler or the additional mixer and ADC. Therefore, these elements are omitted from FIG. 1 for the sake of clarity.

The second VNA 120 incudes a second RF signal generator (not shown), configured to generate another RF signal, and a second LO 123 configured to generate a second LO signal at a second LO frequency. The second VNA 120 further includes a reverse directional coupler 124, a second mixer 125, a second ADC 126, and a second DSP 130. The directional coupler 124 is configured to couple the RF signal generated by the first RF signal generator 112 and received via the second test port 121 to the second mixer 125. The second mixer 125 mixes the received RF signal at the RF frequency with the second LO signal from the second LO 123 at the second LO frequency to output a second IF signal having a second IF frequency. The second ADC 126 digitizes the second IF signal output by the second mixer 125.

The second VNA 120 also includes a second reference clock 127 configured to generate a second reference signal, and a second trigger source 128 configured to generate a second trigger signal. The second reference signal and the second trigger signal are provided to at least the second RF signal generator and the second ADC 126, where the second reference signal creates a second sample rate of the second ADC 126 for sampling the second IF signal output by the second mixer 125.

The second VNA 120 further includes a resampler 129. The resampler 129 is configured to resample the digitized second IF signal output by the second ADC 126 in order to correct for reference error ratio resulting from differences between the first and second reference signals, as discussed below. The resampler 129 may be a known software filter or algorithm implemented by the second DSP 130, for example, although the resampler 129 may alternatively be implemented by the computer system 150. The data sent to the resampler 129 is clocked out of the second ADC 126 at a rate defined by the second reference signal from the second reference clock 127. The second DSP 130 performs signal processing of the resampled second IF signal, and may output the processed second IF signal to the computer system 150, for example. In an embodiment, the second DSP 130 may include the resampler 129.

The second VNA 120 may also include a forward directional coupler configured to couple an RF signal generated by the second RF signal generator to another mixer, which mixes the generated RF signal with the LO signal from the second LO 123 to output an IF signal corresponding to the generated RF signal. The second VNA 120 may also include another ADC for digitizing the IF signal. However, again, since the embodiments as described herein involve transmission of RF signals from the first VNA 110 to the second VNA 120, the forward directional coupler and the additional mixer and ADC are not used. Therefore, these elements are omitted from FIG. 1 for the sake of clarity.

As discussed further below, the system 100 is configured to synchronize the first VNA 110 and the second VNA 120 to enable testing of the DUT 105 over a long range without actually adjusting either of the first reference clock 117 or the second reference clock 127. During a calibration period prior to the testing, the first RF signal generator 112 generates a CW signal (pilot tone) as the RF signal, which has a predetermined RF frequency. The RF signal is transmitted by the first VNA 110 to the second VNA 120 using the first and second antennas 106 and 108. The DUT 105 may or may not be present during the calibration. When the DUT 105 is present, the RF signal passes through the DUT 105 when transmitted from the first VNA 110 to the second VNA 120.

The RF signal transmitted by the first VNA 110 is received at the second test port 121 of the second VNA 120 and measured as measured RF signal. When the DUT 105 is not a frequency converting device, or when the DUT 105 is not present, the measured RF signal has substantially the same RF frequency as the RF signal transmitted by the first VNA 110, offset by a frequency error (discussed below) relative to that RF frequency. When the DUT 105 is a frequency converting device, such as a mixer, the measured RF signal has substantially the same RF frequency as a target RF signal output by the DUT 105 following the frequency conversion of the RF signal transmitted by the first VNA 110, where the RF frequency of the measured RF signal is offset by a frequency error relative to the target RF signal frequency. The measured RF signal is coupled to the second mixer 125 by the directional coupler 124. The second mixer 125 mixes the measured RF signal and the second LO signal generated by the second LO 123, and outputs the second IF signal. As discussed above, the measured RF signal has an RF frequency, the second LO signal has a second LO frequency, and the resulting second IF signal has a second IF frequency determined by the difference between the RF frequency and the second LO frequency.

The computer system 150 determines the reference error ratio between the first reference signal provided by the first reference clock 117 and the second reference signal provided by the second reference clock 127 based on the second LO frequency and the second IF frequency. The reference error ratio ($E_{ref}$) is defined as the ratio of a first reference frequency ($Ref_1$) of the first reference signal and a second reference frequency ($Ref_2$) of the second reference signal ($E_{ref}=Ref_1/Ref_2$). Since the first reference frequency is different from the second reference frequency from the point of view of second VNA 120, it is assumed that the first reference signal is in error for purposes of calculating that difference. Significantly, according to the various embodiments, the second reference clock 127 is not adjusted so that the second reference frequency of the second reference signal actually matches the first reference frequency of the first reference signal. Likewise, the first reference clock 117 is not adjusted so that the first reference frequency of the first reference signal actually matches the second reference frequency of the second reference signal. Rather, the reference error ratio is determined and corrected for while the first and second reference frequencies remain unchanged. The second VNA 120 measures as if the second reference frequency were actually set to the first reference frequency.

In particular, the computer system 150 monitors the second IF frequency of the second IF signal output by the second mixer 125, and adjusts the second LO frequency of the second LO signal at the second LO 123 until the second IF frequency equals an expected IF frequency. When the DUT 105 is not a frequency converting device, or when the DUT 105 is not present, the expected IF frequency is the same frequency as the first IF frequency, which is previously determined based on various system constraints, as would be apparent to one skilled in the art. When the DUT 105 is a frequency converting device, the expected IF frequency is previously determined based on testing requirements for the DUT 105 and various system constraints, as would be apparent to one skilled in the art. The computer system 150 then calculates a frequency error ratio ($E_{RF}$) in the RF frequency of the measured RF signal by determining a mathematical relationship (e.g., sum or difference) between the adjusted second LO frequency and the second (expected) IF frequency, and dividing the mathematical relationship by the RF frequency ($RF_1$) of the RF signal as generated by the first RF signal generator 112 at the first VNA 110. The reference error ratio ($E_{ref}$) is equal to the calculated frequency error ratio ($E_{RF}$).

That is, the second VNA 120 receives the RF signal ($RF_1$) from the first VNA 110, and measures the RF frequency of the corresponding measured RF signal ($RF_{MEAS}$), which includes the frequency error ratio ($E_{RF}$), indicated by $RF_{MEAS}=E_{RF}*RF_1$. When the second LO 123 and the second mixer 125 perform high-side LO mixing, the second IF frequency ($IF_2$) is determined by subtracting the measured RF signal ($RF_{MEAS}$) from the adjusted second LO frequency ($LO_{2adj}$):

$$IF_2 = LO_{2adj} - RF_{MEAS} \qquad \text{Equation (1)}$$

Since the measured RF signal ($RF_{MEAS}$) is equal to $E_{RF}*RF_1$, Equation (1) may be written as follows:

$$E_{RF} * RF_1 = LO_{2adj} - IF_2 \qquad \text{Equation (2)}$$

Accordingly, the mathematical relationship between the adjusted second LO frequency ($LO_{2adj}$) and the second IF frequency ($IF_2$) is the difference between the adjusted second LO frequency ($LO_{2adj}$) and the second IF frequency ($IF_2$), which is equal to the product of the RF frequency ($RF_1$) and the frequency error ratio ($E_{RF}$). Solving Equation (2) for the frequency error ratio provides:

$$E_{RF} = \frac{LO_{2adj} - IF_2}{RF_1} = E_{ref} \qquad \text{Equation (3)}$$

Similarly, when the second LO 123 and the second mixer 125 perform low-side LO mixing, the second IF frequency ($IF_2$) is determined by subtracting the adjusted second LO frequency ($LO_{2adj}$) from the measured RF signal ($RF_{MEAS}$):

$$IF_2 = RF_{MEAS} - LO_{2adj} \qquad \text{Equation (4)}$$

Since the measured RF signal ($RF_{MEAS}$) is equal to $E_{RF}*RF_1$, Equation (4) may be written as follows:

$$E_{RF} * RF_1 = LO_{2adj} + IF_2 \qquad \text{Equation (5)}$$

Accordingly, the mathematical relationship between the adjusted second LO frequency and the second IF frequency is determined by adding the second IF frequency ($IF_2$) to the adjusted second LO frequency ($LO_{2adj}$), which is equal to the product of the RF frequency ($RF_1$) and the frequency error ratio ($E_{RF}$). Solving Equation (5) for the frequency error ratio provides:

$$E_{RF} = \frac{LO_{2adj} + IF_2}{RF_1} = E_{ref} \qquad \text{Equation (6)}$$

The computer system 150 is thus able to calculate the reference error ratio ($E_{ref}$) of the first and second reference signals without having to know the values of either the first reference frequency ($Ref_1$) or the second reference frequency ($Ref_2$).

The computer system 150 then determines a corrected second LO frequency of the second LO signal generated by the second LO 123 that compensates for the reference error by scaling using the reference error ratio. In particular, the computer system 150 applies the reference error ratio ($E_{ref}$) to a desired second LO frequency to determine the corrected second LO frequency. When the DUT 105 is not a frequency converting device, or when the DUT 105 is not present, the desired second LO frequency is the same frequency as the first LO frequency of the first LO signal. When the DUT 105 is a frequency converting device, the desired second LO frequency is previously determined to produce the value of the expected IF frequency, discussed above. For example, the computer system 150 may multiply the desired second LO frequency ($LO_{2desired}$) by the reference error ratio ($E_{ref}$) to obtain the corrected second LO frequency ($LO_{2corrected}$):

$$LO_{2corrected} = LO_{2desired} * E_{ref} \qquad \text{Equation (7)}$$

The computer system 150 controls the LO frequency input to the second LO 123 to generate the second LO signal at the corrected second LO frequency. For example, the second LO 123 may be a voltage controlled oscillator (VCO) phase locked with a fractional-n loop or a DDS, for example.

The second mixer 125 mixes the measured RF signal and the second LO signal at the corrected second LO frequency, which has been adjusted for reference error ratio, and outputs the second IF signal at an expected second IF frequency. The second ADC 126 digitizes the second IF signal at the second sample rate responsive to the second reference signal, and the resampler 129 resamples the digitized second IF signal output by the second ADC 126 at an adjusted sample rate to correct for the reference error ratio. The adjusted sample rate is the product of the second reference frequency ($Ref_2$) and the reference error ratio ($E_{ref}$). As a result, the second VNA 120 appears to be operating with the second reference signal being equal to the first reference signal without having made adjustments to the first reference clock 117 or the second reference clock 127.

In comparison, conventional systems attempt to correct for reference errors by various alternative means, all of which require use of hardware in addition to the first and second VNAs, and processing unit. For example, an optical fiber or an antenna may be used to transmit the reference signal from one VNA to the other. However, this requires the expense of adding the optical fiber or the antenna. A global positioning satellite (GPS) receiver may be installed in each of the VNAs so that they generate similar reference signals. However, this required the expense of installing the GPS receivers at both VNA sites. Or, as described by U.S. Pat. No. 10,386,444 to Stickle et al., the reference error ratio may be measured as the quotient of a first reference signal at a first VNA and a second reference signal at a second VNA (Ref1/Ref2), and then the reference clock at the second VNA is adjusted until the second reference signal matches the first reference signal. However, this requires the ability to adjust the reference clock in the second VNA, which in turn requires additional, special hardware.

Figure 2:
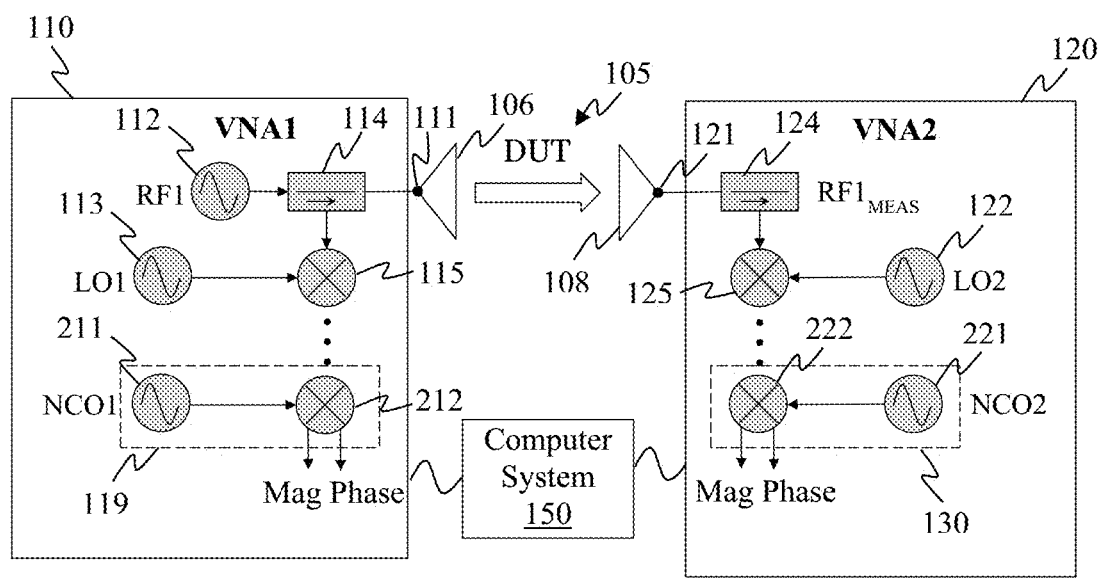
FIG. 2 is a simplified block diagram showing a system for measuring electrical delay of a radio frequency (RF) signal through a DUT over a long distance using a first VNA and a second VNA, according to a representative embodiment.

In various embodiments, once the first and second VNAs 110 and 120 have been effectively synchronized with regard to the first and second reference clocks 117 and 127, delay of the RF signal through the DUT 105 may be determined. FIG. 2 is a simplified block diagram showing a system for measuring electrical delay of an RF signal through a DUT over a long distance, according to a representative embodiment.

Referring to FIG. 2, system 100' is substantially the same as system 100 in FIG. 1, where the first DSP 119 in the first VNA 110 and the second DSP 130 in the second VNA 120 are shown in more detail. In particular, the first DSP 119 includes a VNA1 complex numerically controlled oscillator (NCO) 211 and a first homodyne mixer 212, and the second DSP 130 includes a second complex NCO 221 and a second homodyne mixer 222. In comparison, each of the first mixer 115 and the second mixer 125 is a heterodyne mixer. The other elements of the system 100 are present in the system 100', but are not shown in FIG. 2 for the sake of convenience.

The first homodyne mixer 212 is a digital mixer configured to mix the digitized first IF signal output by the first ADC 116 with a VNA1 NCO signal generated by the first complex NCO 211, and to output a corresponding VNA1 complex signal comprising magnitude and phase of the RF signal generated by the first RF signal generator 112. A VNA1 NCO frequency of the VNA1 NCO signal is the same as the first IF frequency to enable mixing down to DC. Likewise, the second homodyne mixer 222 is a digital mixer configured to mix the digitized and resampled second IF signal output by the resampler 129 with a VNA2 NCO signal generated by the second complex NCO 221, and to output a corresponding VNA2 complex signal comprising magnitude and phase of the measured RF signal from the directional coupler 124. A VNA2 NCO frequency of the VNA2 NCO signal is the same as the second IF frequency to enable mixing down to DC.

Generally, the electrical delay is determined by setting the RF signal generated by first RF signal generator 112 to two different RF frequencies, and setting each of the first and second NCO signals generated by the first and second complex NCOs 211 and 221 to two different first and second NCO frequencies, respectively, corresponding to the two different RF frequencies. The first and second complex NCOs 211 and 221 output two sets of first and second complex signals. The change in phase of the two RF signals is determined based on the phases of the two sets of first and second complex signals, and the change in frequency of the two RF signals is the difference between the two different RF frequencies. The electrical delay is the quotient of the change in phase and the change in frequency.

More particularly, in order to determine the electrical delay of the RF signal, the first LO frequency of the first LO 113 is fixed and the second LO frequency of the second LO 123 is fixed, and remain fixed throughout the measurements. Accordingly, unknown phases of the first and second LOs 113 and 123 will common-mode out of the measurements.

The RF frequency of the RF signal is then set to a first frequency (RFx), the first NCO signal is set to a first NCO frequency (NCO1x), and the second NCO signal is set to a second NCO frequency (NCO2x), which is equal to the first NCO frequency. The first and second NCO frequencies are set in correspondence with the first frequency of the RF signal. That is, the first and second complex NCOs 211 and 221 homodyne the first and second IF frequencies, so the first and second NCO frequencies are equal to the first and second IF frequencies, respectively. In response, the first homodyne mixer 212 outputs phase value (Ax) of a first complex signal and the second homodyne mixer 222 outputs phase value (Bx) of a second complex signal. A first phase (Phase 1) of the RF signal is determined as the quotient of the phase value of the first signal and the phase value of the second complex signal (B1x/A1x).

Next, the RF frequency is set to a second frequency (RFy), the first NCO signal is set to an adjusted first NCO frequency (NCO1y), and the second NCO signal is set to an adjusted second NCO frequency (NCO2y), which is equal to the adjusted first NCO frequency. The adjusted first and second NCO signals are set in correspondence with the second frequency of the RF signal, as described above. In response, the first homodyne mixer 212 outputs phase value (Ay) of an adjusted first complex signal, and the second homodyne mixer 222 outputs phase value (By) of an adjusted second complex signal. A second phase (Phase 2) of the RF signal is determined as the quotient of the phase value of the adjusted second complex signal and the phase value of the adjusted first complex signal (By/Ay).

The change in frequency is calculated as the difference between the second frequency and the first frequency of the RF signal ($\Delta$Freq=RFy−RFx). The change in phase is calculated as the difference between the second phase and the first phase (ΔPhase=Phase 2−Phase 1). Then, the electrical delay is calculated as the negative change in phase divided by the difference between the first and second frequencies (electrical delay=−ΔPhase/ΔFreq). Once the delay is determined, phase difference of the RF signal may likewise be determined by integrating the delay.

Generally, every time the output of an ADC is measured by a homodyne mixer, a different magnitude and phase are typically reported. However, according to various embodiments, time stamps are used when measuring the first and second complex signals at the first and second VNAs 110 and 120, as described, for example, by U.S. Pat. No. 9,887,785 to Anderson et al. (Feb. 6, 2018), which is hereby incorporated by reference in its entirety. Time stamp values indicating the same time are assigned to the measurements at both the first and second VNAs 110 and 120, although the times are not aligned since the first and second reference clocks 117 and 127 are not synchronized. However, multiple measurements have the same error, so the time difference will common-mode out when subtraction is performed to determine phase difference. Accordingly, the magnitude and phase of the first and second complex signals will be constant from measurement to measurement as long as each of the RF frequency, the first LO frequency, and the second LO frequency does not change during the measurement period.

Since the RF frequency and the first and second NCO frequencies are changed when determining the electrical delay, the NCO phases are reset at the beginning of each measurement period so that the time stamping will be correct. That is, since each of the first complex NCO 211 and the second complex NCO 221 is reset at the beginning of a measurement period, the time stamping ensures that moving the corresponding first and second NCO frequencies (NCO1x→NCO1y and NCO2x→NOC2y) will not cause unknown phase errors.

Also, since the digitized second IF signal output by the second ADC 126 is resampled by the resampler 129, the time stamping is applied to the resampled second IF signal. Further, when measuring electrical delay, the resampling kernel is started during initial calibration and left running, so that time is accumulated properly. However, this is not necessary when measuring only dispersion since absolute delay is not measured.

Figure 3:
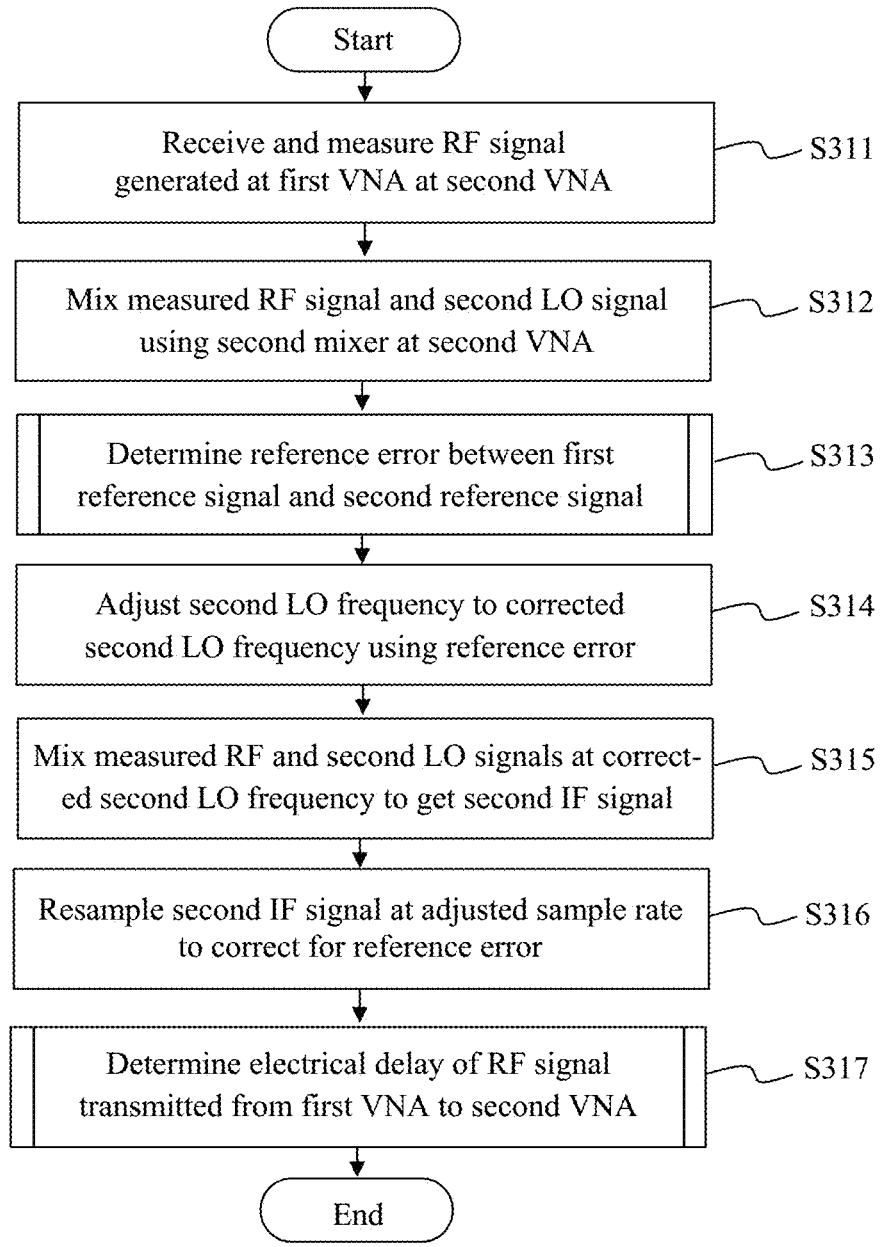
FIG. 3 is a flow diagram of a method of synchronizing a first VNA and a second VNA for testing a DUT over a long distance using a first VNA and a second VNA, according to a representative embodiment.

FIG. 3 is a flow diagram of a method of synchronizing a first VNA and a second VNA for testing a DUT over a long distance using a first VNA and a second VNA, according to a representative embodiment. The method of FIG. 3 may be implemented by the system 100, including the first VNA 110, the second VNA 120, and the computer system 150, described above.

Referring to FIG. 3, an RF signal generated by an RF signal generator (e.g., first RF signal generator 112) at the first VNA is received and measured at the second VNA in block S311 to provide a measured RF signal. The RF signal may be a CW signal, and has an RF frequency.

In block S312, the measured RF signal and a second LO signal are mixed by a second mixer (e.g., second mixer 125) at the second VNA to output a second IF signal to a second ADC (e.g., second ADC 126). The second IF signal has a second IF frequency.

In block S313, a reference error ratio is determined between a first reference signal and a second reference signal. The first reference signal is generated by a first reference clock (e.g., first reference clock 117) and the second reference signal is generated by a second reference clock (e.g., second reference clock 127). The first reference signal drives at least the RF signal generator, a first ADC (e.g., first ADC 116), and a first LO (e.g., first LO 113) at the first VNA, and the second reference signal drives at least the second ADC and a second LO (e.g., second LO 123) at the second VNA.

Figure 4:
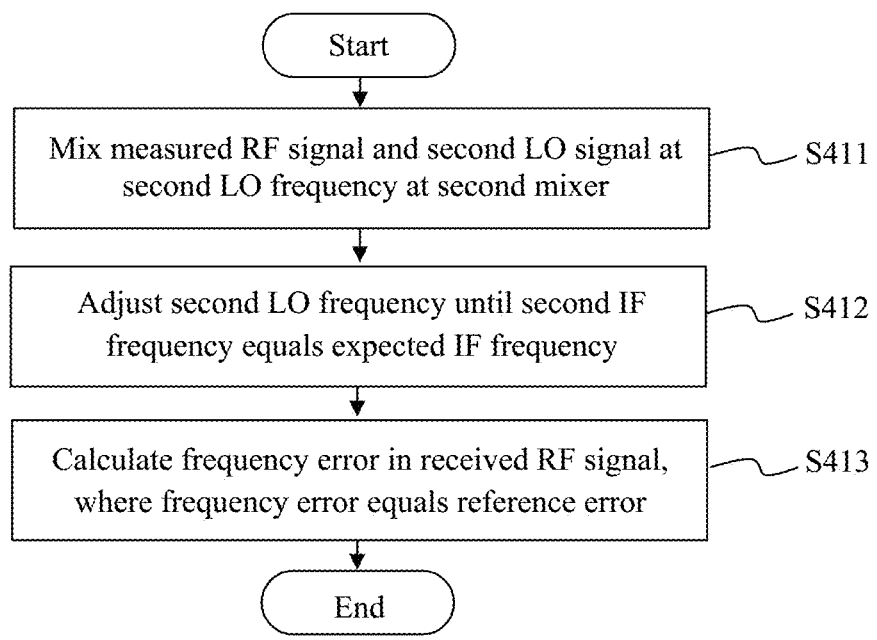
FIG. 4 is a flow diagram of a method of determining reference error ratio between a first reference clock in the first VNA and a second reference clock in the second VNA for testing a DUT over a long range, according to a representative embodiment.

FIG. 4 is a flow diagram of a method of determining the reference error ratio between the first reference clock in the first VNA and the second reference clock in the second VNA, indicated by block S313, according to a representative embodiment. The method of FIG. 4 likewise may be implemented by the system 100, including the first and second VNAs 110 and 120, and the computer system 150, described above.

Referring to FIG. 4, the measured RF signal and the second LO signal at the second LO frequency are mixed at the second mixer in block S411 to output the second IF signal. The second LO frequency is initially set at a desired second LO frequency, e.g., equal to a first LO frequency of the first LO, for down converting the RF frequency targeting a predetermined expected IF frequency.

In block S412, the second LO frequency is adjusted at the second LO until the second IF frequency equals the predetermined expected IF frequency. The expected IF frequency is the frequency of the second IF signal for which the ADC and DSP are tuned for subsequent signal processing.

In block S413, a frequency error ratio in the RF frequency of the measured RF signal is calculated. The frequency error ratio may be calculated by determining a mathematical relationship (e.g., difference or sum) between the adjusted second LO frequency and the second IF frequency, and dividing the mathematical relationship by the RF frequency of the RF signal as generated at the first VNA. As discussed above, when the second LO and the second mixer perform high-side LO mixing, the mathematical relationship between the adjusted second LO frequency and the second IF frequency is determined by subtracting the second IF frequency from the second LO frequency. When the second LO 123 and the second mixer perform low-side LO mixing, the mathematical relationship between the adjusted second LO frequency and the second IF frequency is determined by adding the second IF frequency to the second LO frequency. The reference error ratio is equal to the calculated frequency error ratio.

Referring again to FIG. 3, the second LO frequency is adjusted at the second LO to a corrected second LO frequency in block S314 by applying the reference error ratio determined in block S413 to a desired second LO frequency. As discussed above, when the DUT is not a frequency converting device, or when the DUT is not present, the desired second LO frequency is the same frequency as the first LO frequency of the first LO signal generated by the first LO. When the DUT is a frequency converting device, the desired second LO frequency is a previously determined frequency that produces the value of the expected IF frequency.

In block S315, the measured RF signal is mixed with the second LO signal programmed to the corrected second LO frequency to output the second IF signal at a second IF frequency that is equal to the desired second IF frequency times the reference error ratio (determined in block S313). Again, when the DUT is not a frequency converting device, or when the DUT is not present, the desired second IF frequency is the same frequency as the first LO frequency, and when the DUT is a frequency converting device, the desired second IF frequency is a previously determined frequency of subsequent signal processing.

In block S316, the second IF signal is digitized (measured) by the second ADC, and then resampled at an adjusted sample rate to output a digitized second IF signal that is corrected for the reference error ratio, referred to as the "corrected second IF signal". Accordingly, the second VNA appears to be operating with the second reference signal being equal to the first reference signal without adjustments being made to the second reference clock (or the first reference clock).

In block S317, an electrical delay of the RF signal is optionally determined for the RF signal being transmitted from the first VNA through the DUT to the second VNA, discussed below.

Figure 5:
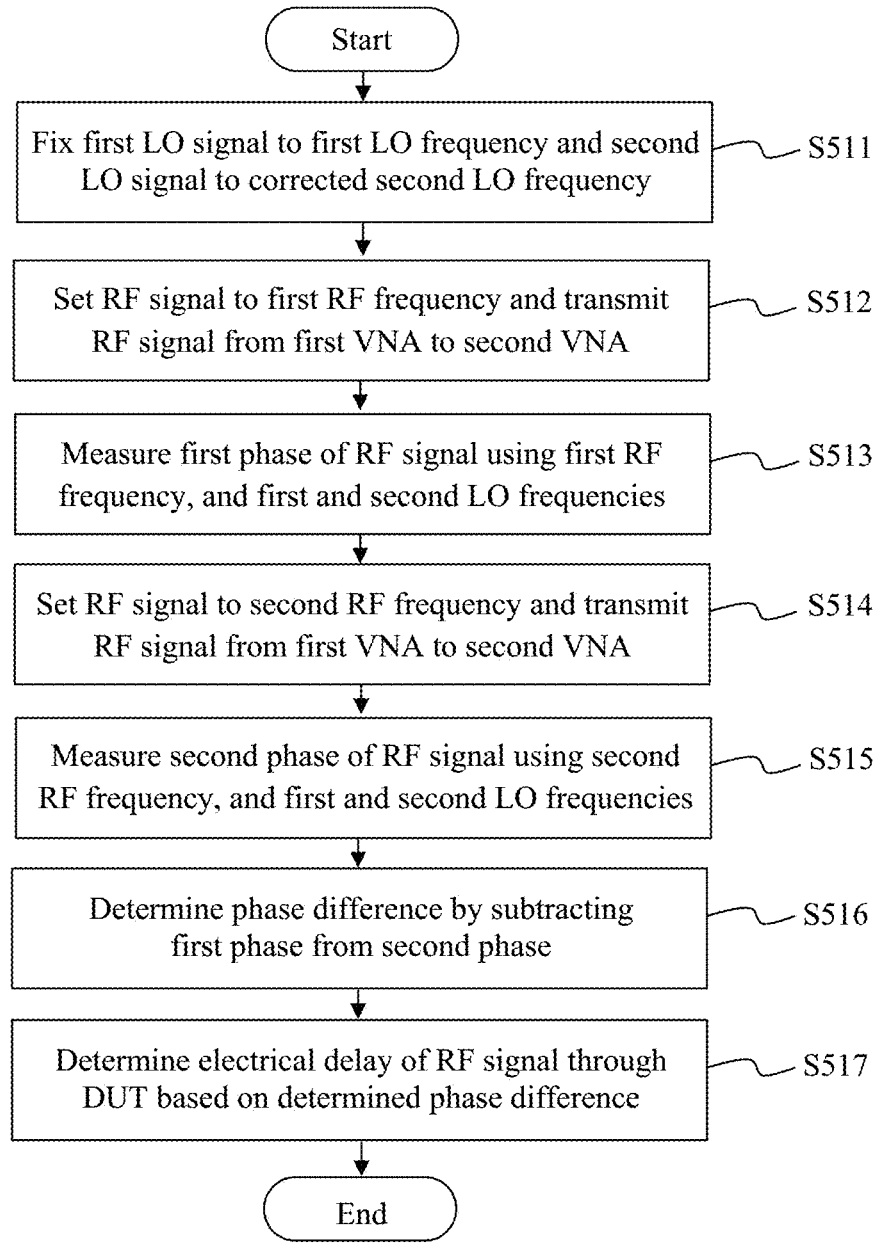
FIG. 5 is a flow diagram of a method of measuring electrical delay of an RF signal through a DUT over a long range using a first VNA and a second VNA, according to a representative embodiment.

FIG. 5 is a flow diagram of a method of determining electrical delay of an RF signal through a DUT over a long range using a first VNA and a second VNA, according to a representative embodiment. The method of FIG. 5 may be implemented by the system 100, 100' including the first VNA 110, the second VNA 120, and the computer system 150, described above.

Referring to FIG. 5, determining the electrical delay of the RF signal includes programming the first LO signal to the first LO frequency at the first VNA, and fixing the second LO signal at the second VNA to the corrected second LO frequency in block S511. Once set, the first and second LO frequencies remained constant throughout the measurement process.

In block S512, the RF signal is set to a first RF frequency at the first RF signal generator. The RF signal at the first RF frequency is transmitted from the first VNA to the second VNA, passing through the DUT.

In block S513, a first phase of the RF signal is measured using the first RF frequency of the RF signal, the first LO frequency of the first LO signal, and the second LO frequency of the second LO signal. Measuring the first phase of the RF signal includes mixing the RF signal and the first LO signal at the first VNA to output a first IF signal, mixing the first IF signal and a first NCO signal from a first NCO to output a first phase value of the first IF signal, mixing the RF signal and the second LO signal at the second VNA to output a second IF signal, and mixing the second IF signal and a second NCO signal from a second NCO to output a second phase value of the second IF signal. The first phase is determined by subtracting the first phase value from the second phase value.

In block S514, the RF signal is set to a second RF frequency different from the first RF frequency at the first RF signal generator. The RF signal at the second RF frequency is transmitted from the first VNA to the second VNA, passing through the DUT.

In block S515, a second phase of the RF signal is measured using the second RF frequency of the RF signal, the first LO frequency of the first LO signal, and the second LO frequency of the second LO signal. Measuring the first phase of the RF signal includes mixing the RF signal generated at the first VNA and the first LO signal to output an adjusted first IF signal, mixing the adjusted first IF signal and the first NCO signal to output an adjusted first phase value of the adjusted first IF signal, mixing the RF signal and the second LO signal at the second VNA to output an adjusted second IF signal, and mixing the adjusted second IF signal and the second NCO signal to output an adjusted second phase value of the adjusted second IF signal. The second phase is determined by subtracting the adjusted first phase value from the adjusted second phase value.

In block S516, a phase difference between the RF signal at the first RF frequency and the RF signal at the second RF frequency is determined. The phase difference may be determined by subtracting the first phase from the second phase.

In block S517, the electrical delay of the RF signal through the DUT is determined by dividing a negative of the determined phase difference by the difference between the second RF frequency and the first RF frequency of the RF signal. The electrical delay is the delay time introduced by the DUT passing the RF signal over the long distance.

Of course, the electrical delay of the RF signal may be determined using other techniques, without departing from the scope of the present teachings. In an alternative embodiment, the electrical delay may be determined by setting the RF signal to first and second RF frequencies at the first RF signal generator, and transmitting the RF signals from the first VNA to the second VNA, but not changing the NCO frequencies. Again, the LO frequencies remain fixed, respectively. In particular, the first and second RF frequencies are chosen such that mixing the RF signal with the first and second LO signals at the first and second mixers, respectively, does not change the first and second IF frequencies of the first and second IF signals. For example, the first and second RF frequencies may be offset below and above the first and second LO frequencies by the same amount, such that each of the first and second LOs and mixers switch from high-side LO mixing to low-side LO mixing with regard to the first and second RF frequencies, respectively.

Otherwise, the technique is substantially the same as discussed above with reference to FIG. 5. That is, the first phase of the RF signal is measured using the first RF frequency of the RF signal, the first LO frequency of the first LO signal, and the second LO frequency of the second LO signal by mixing the RF signal and the first LO signal at the first VNA to output a first IF signal, mixing the first IF signal and the fixed first NCO signal from the first NCO to output a first phase value of the first IF signal, mixing the RF signal and the second LO signal at the second VNA to output a second IF signal, and mixing the second IF signal and the fixed first NCO signal from the second NCO to output a second phase value of the second IF signal. The first phase is determined by subtracting the first phase value from the second phase value.

Likewise, the second phase of the RF signal is measured using the second RF frequency of the RF signal, the first LO frequency of the first LO signal, and the second LO frequency of the second LO signal by mixing the RF signal generated at the first VNA and the first LO signal to output an adjusted first IF signal, mixing the adjusted first IF signal and the fixed first NCO signal to output an adjusted first phase value of the adjusted first IF signal, mixing the RF signal and the second LO signal at the second VNA to output an adjusted second IF signal, and mixing the adjusted second IF signal and the fixed second NCO signal to output an adjusted second phase value of the adjusted second IF signal. The second phase is determined by subtracting the adjusted first phase value from the adjusted second phase value.

The phase difference between the RF signal at the first RF frequency and the RF signal at the second RF frequency is determined by subtracting the first phase from the second phase. The electrical delay of the RF signal through the DUT is determined by dividing a negative of the determined phase difference by the difference between the second RF frequency and the first RF frequency of the RF signal.

In another alternative embodiment, the electrical delay may be determined by modulating the RF signal, and measuring the delay of the envelope of the modulated RF signal. For example, the RF signal generated at the first VNA may be a two-tone signal, where the two tones correspond to the two different frequencies (e.g., first and second RF frequencies RFx and RFy) for measuring the delay, as discussed above. Similarly, the RF signal generated at the first VNA may have more than two tones, and delay is measured using a similar technique with more than two RF frequencies.

In another alternative embodiment, the electrical delay may be determined by turning on the first and second NCOs, and leaving them running so that their phases remain coherent during the measurement.

Figure 6:
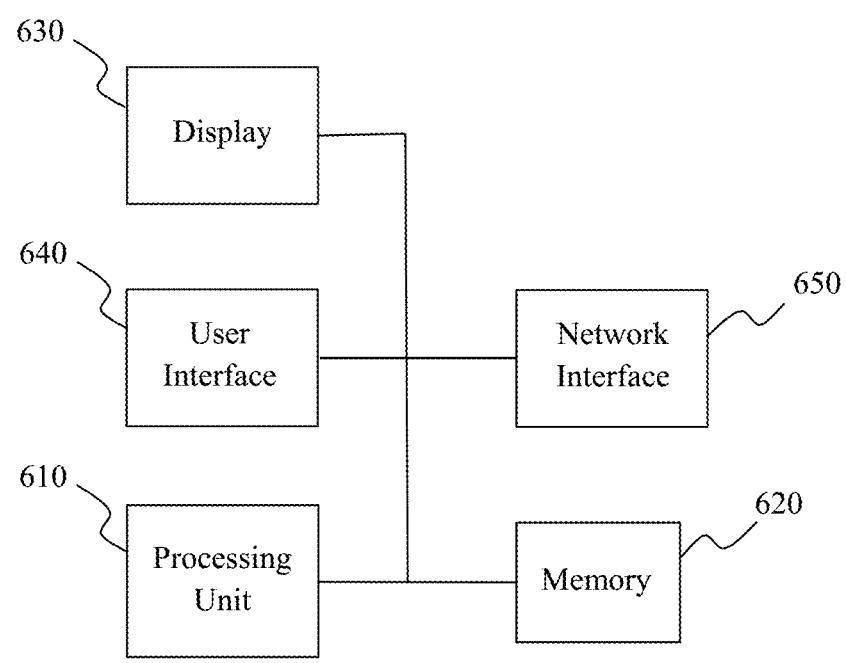
FIG. 6 is a simplified block diagram showing an example of a computer system for testing a DUT over a long distance, according to a representative embodiment.

FIG. 6 is a simplified block diagram showing an example of a computer system for testing a DUT over a long distance, according to a representative embodiment.

Referring to FIG. 6, computer system 150 includes a processing unit 610 and memory 620 for storing instructions executable by the processing unit 610 to implement the processes described herein, as well as a display 630, a user interface 640, and a network interface 650. The processing unit 610 is representative of one or more processing devices and is configured to execute software instructions to perform functions as described in the various embodiments herein, including various steps in the methods set for in FIGS. 3-5, for example. The processing unit 610 may be implemented by a general purpose computer, a personal computer (PC), a central processing unit (CPU), a digital signal processor (DSP), one or more processors, microprocessors or microcontrollers, a state machine, programmable logic device, field programmable gate arrays (FPGAs), application specific integrated circuits (ASICs), or combinations thereof, using any combination of hardware, software, firmware, hard-wired logic circuits, or combinations thereof. The term "processor," in particular, encompasses an electronic component able to execute a program or machine executable instructions. References to a processor should be interpreted to include more than one processor or processing core, as in a multi-core processor, and/or parallel processors. A processor may also refer to a collection of processors within a single computer system or distributed among multiple computer systems, such as in a cloud-based or other multi-site application. Programs have software instructions performed by one or multiple processors that may be within the same computing device or which may be distributed across multiple computing devices.

The memory 620 may include a main memory and/or a static memory, where such memories may communicate with each other and the processing unit 610 via one or more buses. The memory 620 stores instructions used to implement some, or all aspects of methods and processes described herein. The memory 620 may be implemented by any number, type and combination of random-access memory (RAM) and read-only memory (ROM), for example, and may store various types of information, such as software algorithms and computer programs, all of which are executable by the processing unit 610. The various types of ROM and RAM may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of storage medium known in the art.

The memory 620 is a tangible storage medium for storing data and executable software instructions and is non-transitory during the time software instructions are stored therein. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. The memory 620 may store software instructions and/or computer readable code that enables performance of various functions. The memory 620 may be secure and/or encrypted, or unsecure and/or unencrypted.

The display 630 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 630 may also provide a graphical user interface (GUI) for displaying and receiving information to and from the user.

The user interface 640 includes a known interface for providing information and data output by the processing unit 610 and/or the memory 620 to the user, and for receiving information and data input by the user. For example, the user interface 640 enables the user to enter data and to control or manipulate aspects of the processes described herein, and enables the processing unit 610 to indicate the effects of the user's control or manipulation. The user interface 640 may connect one or more user devices, such as a mouse, a keyboard, a trackball, a joystick, a haptic device, a microphone, a video camera, a touchpad, a touchscreen, voice or gesture recognition captured by a microphone or video camera, for example, or any other peripheral or control to permit user feedback from and interaction with the computer system 150.

The network interface 650 includes a known input/output connection to a data communication network, such as a local area network (LAN), a wireless LAN, Wifi, ethernet, or the like. The network interface 650 enables connections between the computer system 150 and each of the first VNA 110 and the second VNA 120. The network interface 650 may further include one or more of ports, disk drives, wireless antennas, or other types of receiver circuitry.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A system for testing a device under test (DUT) over a long distance, the system comprising:
 a first vector network analyzer (VNA) configured to transmit a radio frequency (RF) signal, wherein the first VNA comprises a first reference clock configured to provide a first reference signal;
 a second VNA configured to receive and measure the RF signal transmitted over the long distance from the first VNA to provide a measured RF signal, wherein the second VNA comprises a second reference clock configured to provide a second reference signal, wherein the second reference clock operates independently from the first reference clock; and
 a processing unit programmed to compensate for a reference error between the first reference clock and the second reference clock by adjusting a local oscillator (LO) frequency of an LO signal in the second VNA to determine a reference error ratio between the first reference clock and the second reference clock, correcting the LO frequency using the reference error ratio, mixing the LO signal at the corrected LO frequency and the measured RF signal to obtain an intermediate frequency (IF) signal, and controlling digitizing and resampling of the IF signal in the second VNA to output a corrected IF signal.

2. The system of claim 1, wherein the second VNA further comprises:
 an LO configured to generate the LO signal;
 a mixer configured to mix the measured RF signal and the LO signal at the corrected LO frequency to output the IF signal at an IF frequency;
 an analog to digital converter (ADC) configured to digitize the IF signal output by the mixer; and
 a digital signal processor (DSP) configured to resample the digitized IF signal at an adjusted sample rate to output the corrected IF signal.

3. The system of claim 2, wherein the processing unit is programmed to determine the reference error ratio between the first reference clock and the second reference clock by:
 adjusting the LO frequency at the LO and measuring the output of the mixer until the IF frequency equals a predetermined expected IF frequency; and
 calculating a frequency error ratio in an RF frequency of the measured RF signal by subtracting or adding the adjusted LO frequency and the IF frequency, and dividing a difference or a sum by the RF frequency of the RF signal, wherein the reference error ratio is equal to the frequency error ratio.

4. The system of claim 3, wherein:
 when the LO performs high-side LO mixing, the processing unit is programmed to determine the difference between the adjusted LO frequency and the IF frequency by subtracting the IF frequency from the LO frequency, and
 when the LO performs low-side LO mixing, the processing unit is programmed to determine the sum of the adjusted LO frequency and the IF frequency by adding the IF frequency to the LO frequency.

5. A system for testing a device under test (DUT) over a long distance, the system comprising:
 (i) a first vector network analyzer (VNA), comprising:
  a signal generator configured to generate a radio frequency (RF) signal at an RF frequency; and
  a first reference clock configured to provide a first reference signal at a first reference frequency to at least the signal generator;
 (ii) a second VNA configured to receive and measure the RF signal from the first VNA via the DUT, the second VNA comprising:
  a second local oscillator (LO) configured to generate a second LO signal having a second LO frequency;
  a second mixer configured to mix the measured RF signal and the second LO signal to output a second intermediate frequency (IF) signal;
  a second analog to digital converter (ADC) configured to digitize the second IF signal;
  a resampler configured to resample the digitized second IF signal; and
  a second reference clock configured to provide a second reference signal to at least the second LO and the second ADC, wherein the second reference clock operates independently of the first reference clock; and
 (iii) a processing unit programmed to:
  determine a reference error ratio between the first reference clock and the second reference clock; and
  adjust the second LO frequency at the second LO to a corrected second LO frequency by applying the reference error ratio to a desired second LO frequency,
 wherein the second mixer is further configured to mix the measured RF signal and the second LO signal at the corrected second LO frequency to output the second IF signal, and
 wherein the resampler is configured to resample the digitized second IF signal at an adjusted sample rate to output a corrected second IF signal corrected for the reference error ratio, such that the second VNA appears to use the second reference signal at a second reference frequency equal to the first reference frequency of the first reference signal without adjustments having been made to the first reference clock or the second reference clock.

6. The system of claim 5, wherein the processing unit is programmed to determine the reference error ratio between the first reference clock and the second reference clock by:
 adjusting the second LO frequency of the second LO signal at the second LO, wherein the second mixer mixes the measured RF signal and the second LO signal to output the second IF signal;
 measuring the output of the second mixer until a second IF frequency of the second IF signal equals a predetermined expected IF frequency; and
 calculating a frequency error ratio in the RF frequency of the measured RF signal by determining a mathematical relationship between the adjusted second LO frequency and the second IF frequency, and dividing the mathematical relationship by the RF frequency of the RF signal, wherein the reference error ratio is equal to the frequency error ratio.

7. The system of claim 6, wherein:
 when the second LO performs high-side LO mixing, the processing unit is programmed to determine the mathematical relationship between the adjusted second LO frequency and the second IF frequency by subtracting the second IF frequency from the second LO frequency, and when the second LO performs low-side LO mixing, the processing unit is programmed to determine the mathematical relationship between the adjusted second LO frequency and the second IF frequency by adding the second IF frequency to the second LO frequency.

8. The system of claim 5, wherein the first VNA further comprises:
   a first LO configured to generate a first LO signal having a first LO frequency;
   a first mixer configured to mix the RF signal and the first LO signal to output a first IF signal, wherein the first IF signal has a first IF frequency;
   a first ADC configured to digitize the first IF signal;
   a first numerically controlled oscillator (NCO) configured to generate a first NCO signal having a first NCO frequency that is substantially equal to the first IF frequency; and
   a first NCO mixer configured to mix the first IF signal and the first NCO signal to output a first magnitude value and a first phase value of the RF signal.

9. The system of claim 8, wherein the second VNA further comprises:
   a second NCO configured to generate a second NCO signal having a second NCO frequency that is substantially equal to a second IF frequency of the second IF signal; and
   a second NCO mixer configured to mix the second IF signal and the second NCO signal to output a second magnitude value and a second phase value of the measured RF signal.

10. The system of claim 9, wherein the processing unit is further programmed to:
    determine first and second phase ratios between the first phase value and the second phase value at first and second RF frequencies of the RF signal, respectively;
    determine a phase difference by subtracting the first phase ratio from the second phase ratio; and
    determine an electrical delay of the RF signal through the DUT by dividing a negative of the determined phase difference by a difference between the first and second RF frequencies of the RF signal.

11. The system of claim 5, wherein the second VNA further comprises a digital signal processor (DSP) configured to process the digitized second IF signal, wherein the DSP implements the resampler.

12. The system of claim 5, wherein the RF signal is a continuous wave (CW) signal.

13. A method of synchronizing a first vector network analyzer (VNA) and a second VNA for testing a device under test (DUT) over a long distance, wherein the first VNA includes a first local oscillator (LO) for generating a first LO signal having a first LO frequency and a first analog to digital converter (ADC), wherein the second VNA includes a second LO for generating a second LO signal having a second LO frequency and a second ADC, and wherein the first VNA and the second VNA do not share a reference clock or a trigger signal, the method comprising:
    receiving and measuring at the second VNA a radio frequency (RF) signal from the first VNA, wherein the RF signal is a continuous wave (CW) signal;
    mixing the measured RF signal and the second LO signal at the second VNA to output a second intermediate frequency (IF) signal to the second ADC, wherein the second IF signal has a second IF frequency;
    determining a reference error ratio between a first reference clock and a second reference clock, wherein the first reference clock is configured to provide first reference signals to at least the first LO and the first ADC, and the second reference clock is configured to provide second reference signals to at least the second LO and the second ADC;
    adjusting the second LO frequency at the second LO to a corrected second LO frequency by applying the reference error ratio to a desired second LO frequency;
    mixing the measured RF signal and the second LO signal at the corrected second LO frequency to output the second IF signal;
    digitizing the second IF signal; and
    resampling the digitized second IF signal at an adjusted sample rate to output a corrected second IF signal corrected for the reference error ratio,
    wherein the second VNA appears to be operating with the second reference signal at a second reference frequency equal to a first reference frequency of the first reference signal without adjustments having been made to the first reference clock or the second reference clock.

14. The method of claim 13, wherein determining the reference error ratio between the first reference clock and the second reference clock comprises:
    mixing the measured RF signal and the second LO signal at the second LO frequency to output the second IF signal;
    adjusting the second LO frequency at the second LO until the second IF frequency equals a predetermined expected IF frequency; and
    calculating a frequency error ratio in an RF frequency of the measured RF signal by determining a mathematical relationship between the adjusted second LO frequency and the second IF frequency, and dividing the mathematical relationship by the RF frequency of the RF signal as generated at the first VNA, wherein the reference error ratio is equal to the frequency error ratio.

15. The method of claim 14, wherein:
    when the second LO performs high-side LO mixing, determining the mathematical relationship between the adjusted second LO frequency and the second IF frequency comprises subtracting the second IF frequency from the second LO frequency, and
    when the second LO performs low-side LO mixing, determining the mathematical relationship between the adjusted second LO frequency and the second IF frequency comprises adding the second IF frequency to the second LO frequency.

16. The method of claim 13, wherein resampling the second IF signal at the adjusted sample rate comprises applying a software filter to the digitized second IF signal.

17. The method of claim 16, further comprising:
    determining an electrical delay of the RF signal through the DUT from the first VNA to the second VNA.

18. The method of claim 17, wherein determining the electrical delay of the RF signal through the DUT comprises:
    fixing the first LO signal at the first VNA to the first LO frequency, and the second LO signal at the second VNA to the corrected second LO frequency;
    setting the RF signal to a first RF frequency, and transmitting the RF signal at the first RF frequency from the first VNA to the second VNA;
    measuring a first phase of the RF signal using the first RF frequency of the RF signal, the first LO frequency of the first LO signal, and the second LO frequency of the second LO signal;

setting the RF signal to a second RF frequency different from the first RF frequency, and transmitting the RF signal at the second RF frequency from the first VNA to the second VNA;

measuring a second phase of the RF signal using the second RF frequency of the RF signal, the first LO frequency of the first LO signal, and the second LO frequency of the second LO signal;

determining a phase difference by subtracting the first phase from the second phase; and determining the electrical delay of the RF signal through the DUT by dividing a negative of the determined phase difference by a difference between the second RF frequency and the first RF frequency of the RF signal.

19. The method of claim 17, wherein determining the electrical delay of the RF signal through the DUT comprises:

transmitting the RF signal from the first VNA to the second VNA at each of a first RF frequency and a second RF frequency;

determining a first phase value of a first IF signal output by the first LO using a first numerically controlled oscillator (NCO) at each of the first and second RF frequencies at the first VNA;

determining a second phase value of the second IF signal output by the second LO using a second NCO at each of the first and second RF frequencies at the second VNA;

determining a first phase of the RF signal by subtracting the first phase value from the second phase value at the first RF frequency;

determining a second phase of the RF signal by subtracting the first phase value from the second phase value at the second RF frequency of the RF signal;

determining a phase difference by subtracting the first phase from the second phase; and determining the electrical delay of the RF signal through the DUT by dividing a negative of the determined phase difference by a difference between the second RF frequency and the first RF frequency of the RF signal.

20. The method of claim 13, wherein the CW signal passes through the DUT to be received at the second VNA.

* * * * *